US012660724B2

(12) United States Patent (10) Patent No.: US 12,660,724 B2
Deng et al. (45) Date of Patent: Jun. 16, 2026

(54) ROUTING SUBSTRATES WITH CAVITIES FOR COMPONENT STACKING

(71) Applicant: Apple Inc., Cupertino, CA (US)

(72) Inventors: Yikang Deng, Cupertino, CA (US); Yifan Kao, Taoyuan (TW); Jun Chung Hsu, Cupertino, CA (US); Taegui Kim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 458 days.

(21) Appl. No.: 18/365,891

(22) Filed: Aug. 4, 2023

(65) Prior Publication Data

US 2025/0046689 A1     Feb. 6, 2025

(51) Int. Cl.
    *H10W 90/00*     (2026.01)
    *H10W 70/63*     (2026.01)

(52) U.S. Cl.
    CPC ....... *H10W 90/701* (2026.01); *H10W 70/635* (2026.01); *H10W 90/722* (2026.01)

(58) Field of Classification Search
    CPC ......... H01L 23/49816; H01L 23/49827; H01L 24/16; H01L 2224/16146; H01L 21/4857; H01L 23/49811; H01L 23/49822; H01L 23/5385
    See application file for complete search history.

(56) References Cited

U.S. PATENT DOCUMENTS

| | | | |
|---|---|---|---|
| 8,536,695 B2 * | 9/2013 | Liu | .................... H01L 23/49827 |
| | | | 174/262 |
| 11,043,457 B2 | 6/2021 | Alur et al. | |
| 2007/0069371 A1 * | 3/2007 | Iksan | .................. H01L 23/3128 |
| | | | 438/106 |
| 2010/0288549 A1 | 11/2010 | Chiang et al. | |
| 2012/0228754 A1 * | 9/2012 | Liu | .................... H01L 23/49827 |
| | | | 257/676 |
| 2014/0062607 A1 | 3/2014 | Nair et al. | |
| 2014/0246227 A1 * | 9/2014 | Lin | ..................... H01L 23/5389 |
| | | | 174/266 |
| 2014/0360759 A1 | 12/2014 | Kunieda et al. | |
| 2016/0071818 A1 | 3/2016 | Wang et al. | |
| 2016/0081182 A1 * | 3/2016 | Kang | ...................... H01L 23/13 |
| | | | 174/251 |
| 2017/0053903 A1 | 2/2017 | Nishimura et al. | |
| 2018/0358298 A1 | 12/2018 | Zhai et al. | |
| 2019/0319626 A1 | 10/2019 | Dabral et al. | |
| 2020/0152566 A1 * | 5/2020 | Oh | .......................... H01L 23/13 |
| 2020/0273843 A1 | 8/2020 | Zhong et al. | |
| 2020/0381383 A1 | 12/2020 | Hsu et al. | |

(Continued)

*Primary Examiner* — Douglas W Owens
(74) *Attorney, Agent, or Firm* — Aikin & Gallant, LLP

(57) ABSTRACT

Routing substrates, methods of manufacture, and electronic assemblies including routing substrates are described. In an embodiment, a routing substrate includes a plurality of metal routing layers, a plurality of dielectric layers including a top dielectric layer forming a topmost surface, and a cavity formed in the topmost surface. The cavity may include a bottom cavity surface, a first plurality of first surface mount (SMT) metal bumps embedded within the top dielectric layer and protruding from the topmost surface of the top dielectric layer, and a second plurality of second SMT metal bumps embedded within an intermediate dielectric layer of the plurality of dielectric layers and protruding from the bottom cavity surface.

20 Claims, 13 Drawing Sheets

(56) References Cited

U.S. PATENT DOCUMENTS

| | | | |
|---|---|---|---|
| 2021/0084777 A1 | 3/2021 | Adjiwibawa et al. | |
| 2021/0307172 A1* | 9/2021 | Darmawikarta | H05K 1/116 |
| 2022/0093522 A1 | 3/2022 | Shanmugam et al. | |
| 2022/0254754 A1* | 8/2022 | Elsherbini | H01L 25/0652 |

* cited by examiner

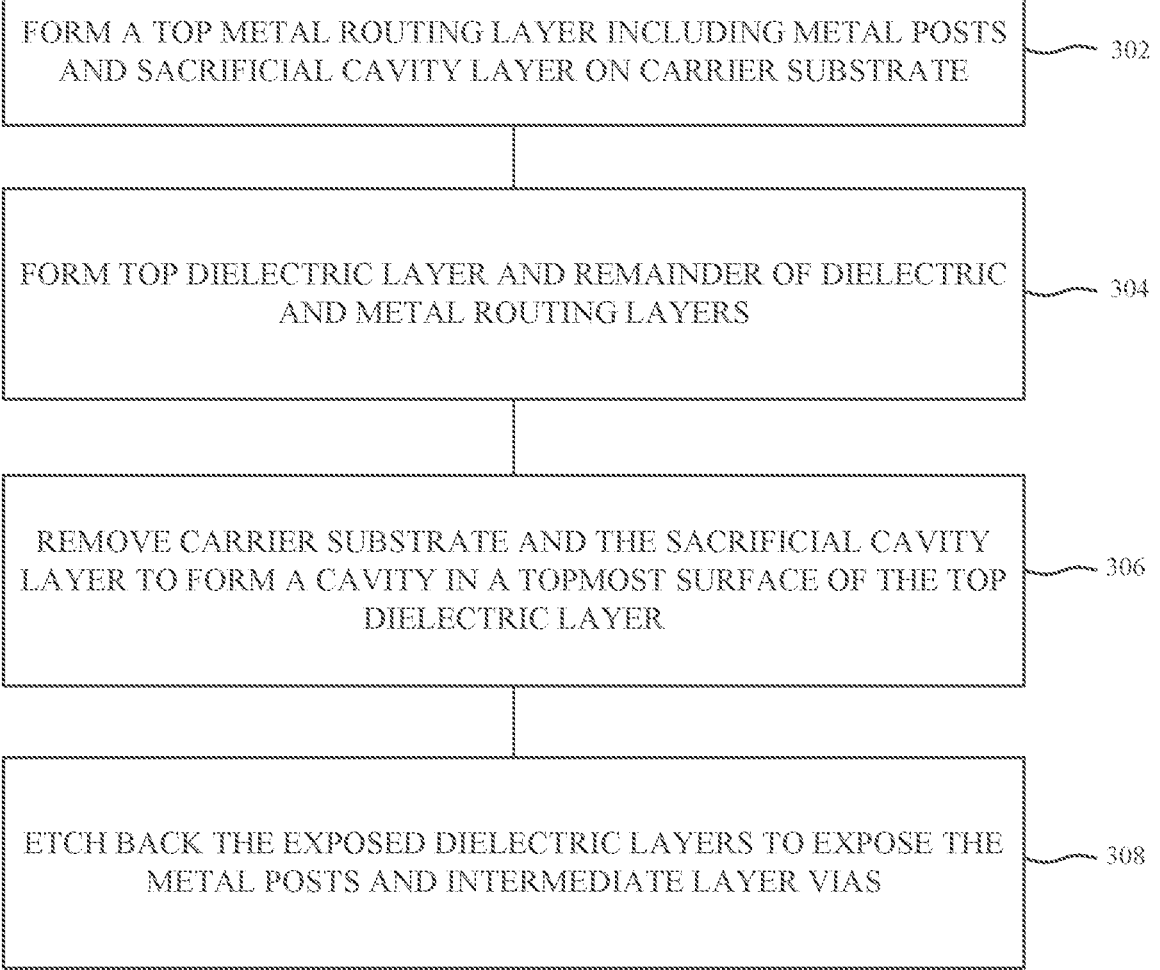

FORM A TOP METAL ROUTING LAYER INCLUDING METAL POSTS AND SACRIFICIAL CAVITY LAYER ON CARRIER SUBSTRATE ⟍ 302

FORM TOP DIELECTRIC LAYER AND REMAINDER OF DIELECTRIC AND METAL ROUTING LAYERS ⟍ 304

REMOVE CARRIER SUBSTRATE AND THE SACRIFICIAL CAVITY LAYER TO FORM A CAVITY IN A TOPMOST SURFACE OF THE TOP DIELECTRIC LAYER ⟍ 306

ETCH BACK THE EXPOSED DIELECTRIC LAYERS TO EXPOSE THE METAL POSTS AND INTERMEDIATE LAYER VIAS ⟍ 308

*FIG. 3*

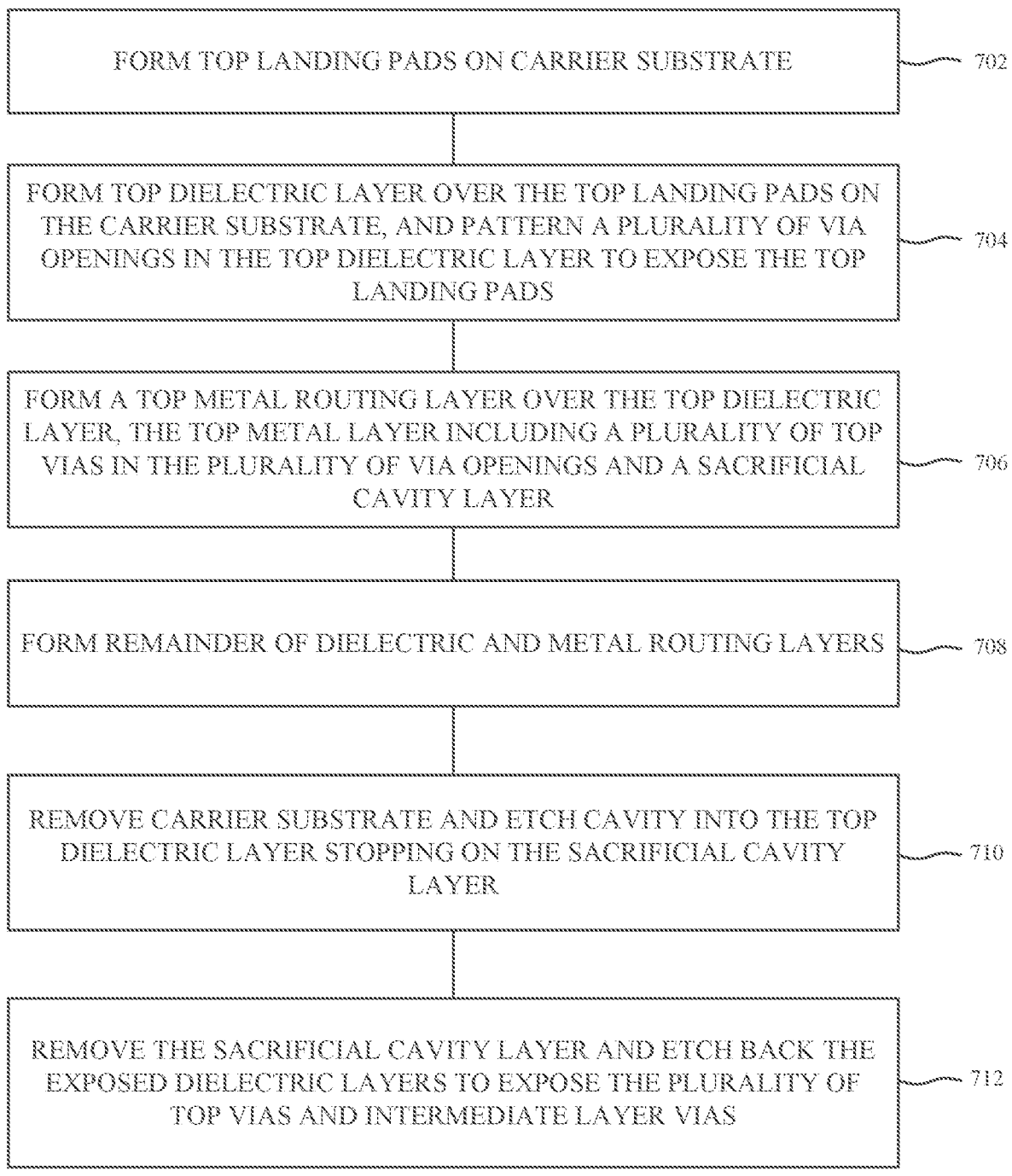

FORM TOP LANDING PADS ON CARRIER SUBSTRATE — 702

FORM TOP DIELECTRIC LAYER OVER THE TOP LANDING PADS ON THE CARRIER SUBSTRATE, AND PATTERN A PLURALITY OF VIA OPENINGS IN THE TOP DIELECTRIC LAYER TO EXPOSE THE TOP LANDING PADS — 704

FORM A TOP METAL ROUTING LAYER OVER THE TOP DIELECTRIC LAYER, THE TOP METAL LAYER INCLUDING A PLURALITY OF TOP VIAS IN THE PLURALITY OF VIA OPENINGS AND A SACRIFICIAL CAVITY LAYER — 706

FORM REMAINDER OF DIELECTRIC AND METAL ROUTING LAYERS — 708

REMOVE CARRIER SUBSTRATE AND ETCH CAVITY INTO THE TOP DIELECTRIC LAYER STOPPING ON THE SACRIFICIAL CAVITY LAYER — 710

REMOVE THE SACRIFICIAL CAVITY LAYER AND ETCH BACK THE EXPOSED DIELECTRIC LAYERS TO EXPOSE THE PLURALITY OF TOP VIAS AND INTERMEDIATE LAYER VIAS — 712

*FIG. 7*

ROUTING SUBSTRATES WITH CAVITIES FOR COMPONENT STACKING

BACKGROUND

Field

Embodiments described herein relate to semiconductor packaging, and more particularly to routing substrates with cavities for component stacking.

Background Information

Routing substrates for application in semiconductor packaging and connection between electronic components can assume a variety of configurations depending upon application. Common routing substrates include rigid circuit boards, flexible circuit boards and flexible cables (collectively referred to as flex circuits), and rigid-flex circuits including both rigid and flexible substrates laminated together, print circuit boards (PCBs), interposers, and high-density redistribution layers (RDLs).

More recently, it has been proposed to integrate various dies or components into a routing substrate in order to increase packing density within a multi-die integrated circuit configuration.

SUMMARY

Routing substrates, electronic assemblies including the routing substrates and methods of manufacture are described. In accordance with embodiments, a routing substrate may include a cavity in which surface mount (SMT) metal bumps protrude from a bottom cavity surface. The cavity may accommodate an electronic component, such as a die or interposer, which may connect to the SMT metal bumps protruding from the bottom cavity surface. Further, one or more top dies may connect to additional SMT metal bumps on a top surface of the substrate. The one or more top dies may span over the electronic component arranged in the cavity. As a result, computing performance and/or power efficiency may be improved while maintaining the small form factor or thinness of the electronic assembly formed with the routing substrate.

In an embodiment, a routing substrate includes a plurality of metal routing layers, a plurality of dielectric layers including a top dielectric layer forming a topmost surface, and a cavity formed in the topmost surface. A first plurality of first SMT metal bumps may be embedded within the top dielectric layer and protrude from the topmost surface of the top dielectric layer, and a second plurality of second SMT metal bumps may be embedded within an intermediate dielectric layer of the plurality of dielectric layers and protrude from a bottom cavity surface of the cavity.

BRIEF DESCRIPTION OF THE DRAWINGS

FIG. 3 is a flow chart illustrating a method of fabricating a routing substrate including a cavity for component stacking in accordance with an embodiment.

FIG. 7 is a flow chart illustrating a method of fabricating a routing substrate including a cavity for component stacking in accordance with an embodiment.

DETAILED DESCRIPTION

Figure 1:
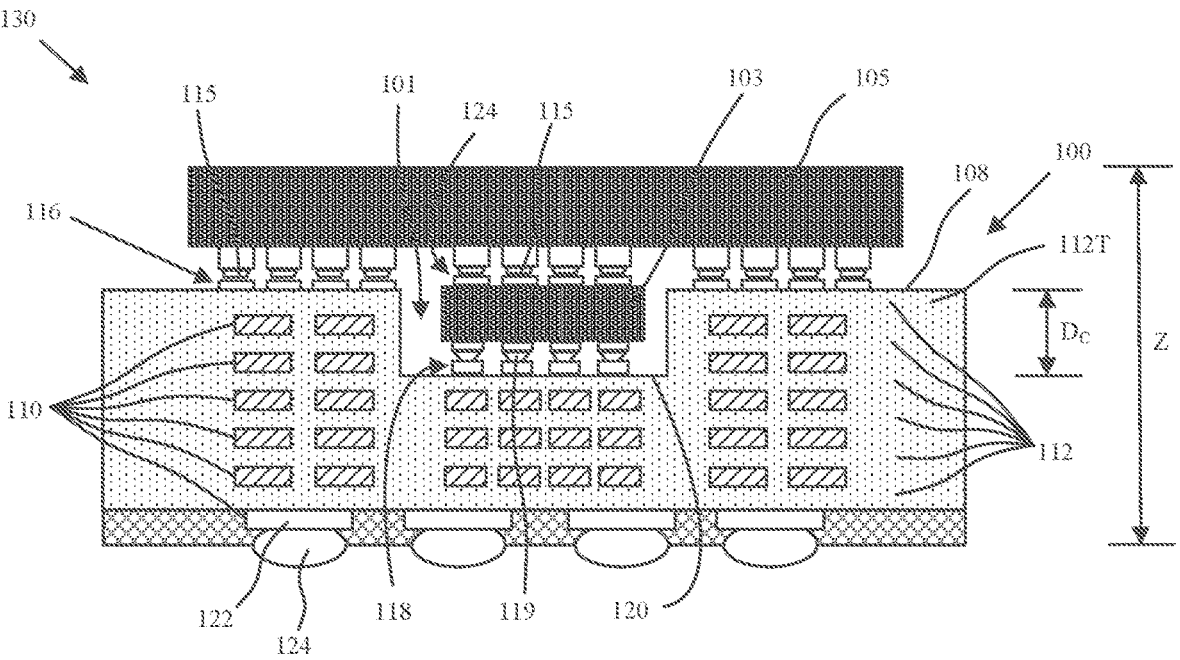
FIG. 1 is a close-up cross-sectional side view illustration of an electronic assembly including a routing substrate with cavity for component stacking in accordance with an embodiment.

Routing substrates, methods of manufacture, and electronic assemblies (e.g., electronic packages) including routing substrates are described. The routing substrates may include cavities for component stacking. In some implementations, the routing substrate may be a coreless substrate, such as a substrate including thin dielectric layers without glass woven reinforcement, or a substrate including a mixture of dielectric layers without glass woven reinforcement and dielectric layers with glass woven reinforcement. The cavity may enable 3D integrated circuit (IC) stacking. The cavity may be formed with an adjustable cavity depth at a top side of the routing substrate. The cavity can be used to accommodate various electronic components, such active silicon dies, integrated passive devices, interposers (e.g., silicon or glass), and/or high density organic substrates. SMT metal bumps may protrude from a bottom cavity surface of the cavity to facilitate bonding quality of the component(s) inside the cavity. Furthermore, where components include vertical interconnections, this may facilitate direct electrical connections between the bottom side of the routing substrate (e.g., bottom side of a package), through the component(s) to one or more dies mounted on top of the components. The various components placed inside the cavity can enable improved computing performance and/or power efficiency, such as an improved system on chip (SoC), while maintaining the small form factor or thinness of the electronic assembly (e.g., without impacting total package z-height or body size).

In some embodiments, the SMT metal bumps may be copper post defined, laser via defined, or a combination thereof. In some cases, the SMT metal bumps may be defined based on the cavity depth that is implemented.

In some embodiments, the SMT metal bumps may include a bump structure of protruded individual metal bumps inside a cavity which may be formed in a coreless substrate. The SMT metal bumps may be used, for example, to connect a component directly to a ball grid array (BGA) on the bottom side of the substrate.

In some embodiments, the cavity depth may be adjustable based on a height of the component arranged in the cavity. This may enable a top surface of the component arranged in the cavity to be flush with SMT metal bumps on a top surface of the routing substrate for an improved assembly window, such as receiving controlled collapse chip connections (C4 bumps) of one or more top dies.

In some embodiments, the component can be an active silicon die, which may include through silicon vias (TSVs), an integrated passive device, or an interposer (e.g., silicon or glass) with high routing density (e.g., based on an organic substrate).

In some embodiments, the routing substrate may include multiple cavities to accommodate multiple components. For example, the routing substrate could include a first cavity in the top surface to receive a first component, such as an active die, and a second cavity in the top surface to receive a second component, such as an interposer.

In various embodiments, the location of a cavity can vary on the surface of the routing substrate. For example, in some embodiments, the cavity can be completely under one die (e.g., inside the footprint of a top die, such as an SoC). In some embodiments, the cavity can be at the boundary of two neighboring dies (e.g., within a first footprint of a first top die and within a second footprint of a second top die). In some embodiments, the cavity can be completely outside of the die (e.g., outside of a footprint of a top die). The die(s), as well as the component(s), can be a variety dies, such as SoC, graphics processing unit (GPU), central processing unit (CPU), artificial intelligence (AI), machine learning logic, radio-frequency (RF) baseband processor, radio-frequency (RF) antenna, signal processors, power management integrated circuit (PMIC), logic, memory, photonics, biochips, low speed and/or high speed input/output (HSIO), cache, a silicon interconnect and any combinations thereof. The silicon interconnect, for example, can be a chiplet including lateral routing for die-to-die connections. In some embodiments, no logic or passive devices are included in the silicon interconnect, and the silicon interconnect is used primarily for fine die-to-die wiring. In other embodiments capacitors or logic can be included within the silicon interconnect in combination with the fine die-to-die wiring.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

FIG. 1 is a close-up cross-sectional side view illustration of an electronic assembly 130 (e.g., electronic package) including a routing substrate 100 with cavity 101 for component stacking in accordance with an embodiment. The routing substrate 100 is high level example that is generic for multiple embodiments. The routing substrate 100 may not include all details of all embodiments. The routing substrate 100 may utilize the cavity 101 to enable an electronic component 103, arranged in the cavity 101, to be stacked relative to a top die 105 arranged above the cavity 101 (e.g., 3D IC stacking). For example, the electronic component 103 could be an active die (e.g., a second die) with TSVs, an integrated passive device, an interposer (e.g., silicon or glass), or high density organic substrate. In another example, the top die 105 could be an SoC which may be connected to the electronic component 103, including via TSVs. In some cases, the electronic component 103 could be one of multiple electronic components in the cavity 101, and/or the top die 105 could be one of multiple top dies arranged above the cavity 101. In some cases, the routing substrate 100 may include multiple cavities like the cavity 101, each of which may include an electronic component. As a result, the cavity 101 can be used to accommodate various electronic components, top dies, and connections thereof.

The routing substrate 100 may be coreless substrate. For example, the routing substrate 100 may include a plurality of alternating metal layers and dielectric layers, without an interior core for mechanical support. It is to be appreciated that this is an exemplary implantation, and embodiments are not limited to coreless substrates, or specific materials described herein. In an embodiment, the routing substrate 100 includes a plurality of dielectric layers without glass woven reinforcement and copper metal routing layers. In another embodiment, the routing substrate 100 includes a plurality of dielectric layers that is a mixture of layers with glass woven reinforcement and layers without glass woven reinforcement. In an exemplary implementation the dielectric layers may be formed by lamination, followed by laser drilling of via openings and plating of the metal routing layers, which include metal routing lines and vias. The metal routing layers forming the SMT metal bumps, as well as the cavity 101, may be formed using a variety of techniques described herein. The cavity 101 may be formed with an adjustable cavity depth (Dc) in a topmost surface 108 of the routing substrate 100. The adjustable cavity depth (Dc) may enable various sizes of the electronic component 103 to be arranged in the cavity 101 depending on the configuration.

Figure 2:
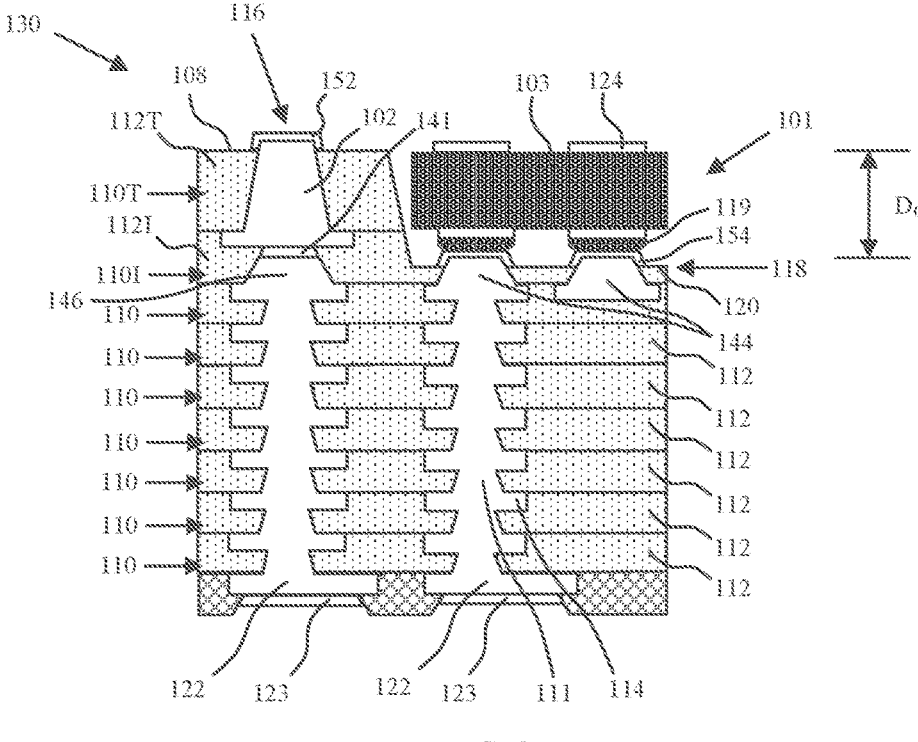
FIG. 2 is a close-up cross-sectional side view illustration of a routing substrate including a cavity for component stacking in accordance with an embodiment.

Referring to FIG. 2 in combination with FIG. 1, the routing substrate 100 may include a plurality of metal routing layers 110 and a plurality of dielectric layers 112, including a top dielectric layer 112T forming the topmost surface 108. In some embodiments, the plurality of dielectric layers 112 may be a plurality of non-glass reinforced organic material layers. In some embodiments, the plurality of dielectric layers 112 may be a mixture of non-glass reinforced organic layers and glass fiber reinforced organic layers. In some embodiments, the plurality of dielectric layers 112 may be a plurality of cured resin layers. The cavity 101 may extend through one or more dielectric layers of the plurality of dielectric layers 112, including the top dielectric layer 112T.

A first plurality of first SMT metal bumps 116 may be embedded within the top dielectric layer 112T and protrude from the topmost surface 108. A second plurality of second SMT metal bumps 118 may be embedded within an intermediate dielectric layer 112I of the plurality of dielectric layers 112 (e.g., one or more dielectric layers below the top dielectric layer 112T) and protrude from a bottom cavity surface 120 of the cavity 101. The protruding SMT metal bumps can be formed using subtractive techniques in which the dielectric layers are etched back to expose corresponding bulk metal layers (e.g., vias, posts). The protrusion height of the exposed bulk metal layer above the corresponding etched-back surfaces can be adjusted to facilitate surface mounting of the components and dies. Furthermore, surface finishing layers 152, 154 can be applied to the protruding bulk metal layers after etch-back to provide a desired bonding surface material for the SMT metal bumps, as well as protective layer(s) to enhance the connection quality and overall performance. In accordance with embodiments, the same surface finishing layer can be applied for the first plurality of first SMT metal bumps 116 along protruding from the topmost surface 108 of the routing substrate 100 and the second plurality of second SMT metal bumps 118 protruding from the bottom cavity surface 120.

The top die(s) 105 can be mounted on the first plurality of first SMT metal bumps 116 (e.g., bonded to the first plurality of first SMT metal bumps 116 with a solder material 115, such as C4 bumps). The first plurality of first SMT metal bumps 116 may enable direct electrical connections from the top die(s) 105 to a plurality of contact pads 122 arranged on a back side of the routing substrate 100 (e.g., a bottom side of the package, opposite the topmost surface 108). Additionally, the top die(s) 105 may be bonded to a plurality of contact pads 124 on a top side of the electronic component 103 with solder material 115. In some embodiments, this may provide a communication path for the top die 105 through the electronic component 103.

The electronic component 103 may be mounted on the second plurality of second SMT metal bumps 118 (e.g., bonded to the second plurality of second SMT metal bumps 118 with a solder material 119, or micro bumps). The second plurality of second SMT metal bumps 118 may enable direct electrical connections from the electronic component 103, arranged in the cavity 101, to the contact pads 122 arranged on the back side of the routing substrate 100. In some cases, the second plurality of second SMT metal bumps 118 may enable direct electrical connections from the top die 105, via the electronic component 103, to the contact pads 122.

The routing substrate 100, the top die 105, and the electronic component 103 may form an electronic assembly 130 (e.g., electronic package) that can be utilized in a system. The electronic component 103, configured inside the cavity 101, may enable improved computing performance and/or power efficiency in the system while maintaining a small form factor or thinness (e.g., without impacting the total package z-height (Z) or body size of the electronic assembly 130).

In some embodiments, the plurality of first SMT metal bumps 116 include a first bulk metal layer 102 that may be (copper) post defined (e.g., FIGS. 4A-4H), (laser) via defined (e.g., FIGS., 6A-6H), (copper) landing pad defined (e.g., FIGS. 8A-8F), or a combination thereof. Further, the plurality of first SMT metal bumps 116 may be defined based on the cavity depth (Dc) implemented.

The second plurality of second SMT metal bumps 118 may include a bump structure of protruded individual metal vias inside the cavity 101.

The cavity depth (Dc) may be adjustable based on a height of the electronic component 103. This may enable a top surface of the electronic component 103, arranged in the cavity 101, to be flush with the first plurality of first SMT metal bumps 116 on the topmost surface 108 for an improved assembly window.

The location of the cavity 101 can vary on the topmost surface 108. For example, in some embodiments, the cavity 101 can be completely under the top die 105 as shown in FIG. 1 (e.g., inside the footprint of the top die 105). For example, the top die 105 can span over the electronic component 103 completely. In some embodiments, the cavity 101 can be at the boundary of the top die 105 and/or another top die (e.g., within a footprint of the top die 105 and within a second footprint of a second top die). For example, the top die 105 can span over the electronic component 103 partially. In another example, the top die 105 could be one of multiple top dies spanning over the electronic component 103. In some embodiments, the cavity 101 can be completely outside of any top die (e.g., outside of the footprint of the top die 105). While not illustrated, an underfill material (e.g., epoxy) can be applied to the component 103 within the cavity 101. Furthermore, the cavity can optionally be filled with an insulating material.

FIG. 2 is a close-up cross-sectional side view illustration of a routing substrate 100 including a cavity 101 for component stacking in accordance with an embodiment. The routing substrate 100 is another high level example that is generic for multiple embodiments. The routing substrate 100 may not include all details of all embodiments. The routing substrate 100 may utilize the cavity 101 to enable an electronic component 103, arranged in the cavity 101, to be stacked relative to a top die (e.g., the top die 105) arranged above the cavity 101.

The routing substrate 100 may be coreless substrate. For example, the routing substrate 100 may include thin dielectric layers without glass woven reinforcement, or a mixture of dielectric layers without glass woven reinforcement and dielectric layers with glass woven reinforcement. The cavity 101 may be formed with an adjustable cavity depth (Dc) in a topmost surface 108 of the routing substrate 100. The adjustable cavity depth (Dc) may enable various sizes of the electronic component 103 to be arranged in the cavity 101 depending on the configuration.

As shown in FIG. 2, the routing substrate 100 includes a plurality of metal routing layers 110 formed in a plurality of dielectric layers, including a top dielectric layer 112T forming a topmost surface 108. In some embodiments, the plurality of dielectric layers 112 may be a plurality of non-glass reinforced organic material layers. In some embodiments, the plurality of dielectric layers 112 may be a mixture of non-glass reinforced organic layers and glass fiber reinforced organic layers. In some embodiments, the plurality of dielectric layers 112 may be a plurality of cured resin layers. The cavity 101 may extend through one or more dielectric layers of the plurality of dielectric layers, including the top dielectric layer 112T and into an intermediate dielectric layer 112I.

A first plurality of first SMT metal bumps 116 may be embedded within the top dielectric layer 112T and protrude from the topmost surface 108 of the top dielectric layer 112T. A second plurality of second SMT metal bumps 118 may be embedded within an intermediate dielectric layer 112I of the plurality of dielectric layers and protrude from a bottom cavity surface 120 of the cavity 101. Each second SMT metal bump of the second plurality of second SMT metal bumps 118 may include an intermediate metal via 144 (e.g., including copper, embedded in at least the intermediate dielectric layer 112I of the plurality of dielectric layers, below the top dielectric layer 112T) and may protrude from the bottom cavity surface 120. Each second SMT metal bump of the second plurality of second SMT metal bumps 118 may also include a second surface finishing layer 154 over the intermediate metal via 144, such as a nickel-palladium-gold layer stack. Further, first SMT metal bumps of the first plurality of first SMT metal bumps 116 may include a bulk metal layer 102 (e.g., metal post, metal via, metal landing pad) protruding from the topmost surface 108. Each first SMT metal bump of the first plurality of first SMT metal bumps 116 may also include a first surface finishing layer 152 over the protruding bulk metal layer 102.

In accordance with embodiments the second SMT metal bumps 118, and in particular the intermediate metal vias 144 are formed in an intermediate metal routing layer 110I of the plurality of metal routing layers 110. The intermediate metal routing layer 110I may be one or more metal levels below the top metal routing layer 110T used to form the first SMT metal bumps 116, and in particular the bulk metal layer 102 thereof.

The second SMT metal bumps 118 may enable direct connections between the electronic component 103, arranged in the cavity 101, and a plurality of contact pads 122 arranged on a back side of the routing substrate 100. Further, the first SMT metal bumps 116 may enable direct connections between a top die (e.g., the top die 105) and a plurality of contact pads 122 arranged on a back side of the routing substrate 100. It is to be appreciated that complex routing arrangements may be included within the routing substrate 100 and between the first and second SMT metal bumps. Still referring to FIG. 2, the metal routing layers 110 (including top metal routing layer 110T and intermediate metal routing layer 110I) can include a combination of metal vias 114 and metal routing lines 111. Such an arrangement is labeled for only a single metal routing layer within FIG. 2 in order to not obscure the embodiments. It is to be appreciated that any metal routing layer in accordance with embodiments may include an arrangement of metal vias, metal routing lines, metal planes, etc.

FIG. 3 is a flow chart illustrating a method of fabricating a routing substrate including a cavity for component stacking in accordance with an embodiment. FIGS. 4A-4H are schematic cross-sectional side view illustrations of a sequence of forming a routing substrate including a cavity for component stacking in accordance with an embodiment. For example, the flow chart of FIG. 3 and the sequences illustrated in FIGS. 4A-4H may be utilized to form the routing substrate 100 of FIG. 1. In interest of clarity and conciseness, the flow chart of FIG. 3 is described concurrently with the sequences illustrated in FIGS. 4A-4H.

Figure 4A:
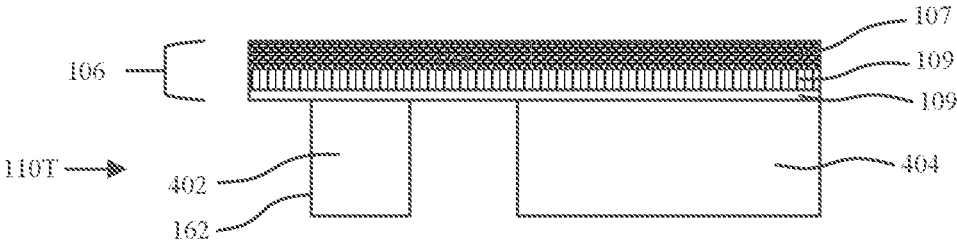
FIGS. 4A-4H are schematic cross-sectional side view illustrations of a sequence of forming a routing substrate including a cavity for component stacking in accordance with an embodiment.

At operation 302, a top metal layer 110T including metal posts 402 and a sacrificial cavity layer 404 may be formed on a carrier substrate 106 as shown in FIG. 4A. It is to be appreciated that while a single metal post 402 and sacrificial cavity layer 404 are shown that a plurality of metal posts 402 and optionally a plurality of sacrificial cavity layers may be formed. The carrier substrate 106 may include a carrier core 107 and one or more layers of copper foil 109 for example, with the top metal layer 110T formed of copper. In an embodiment, the metal post 402 and sacrificial cavity layer 404 are selectively plated into a patterned layer, such as patterned photoresist. In such an embodiment, the metal post 402 may have straight sidewalls 162. Similarly, the sacrificial cavity layer 404 may have straight sidewalls. As will become apparent in the following description the metal posts 402 will become the protruding bulk layers 102 of the first SMT metal bumps 116, while the sacrificial cavity layer 404 is used to define the cavity to be formed.

Figure 4B:
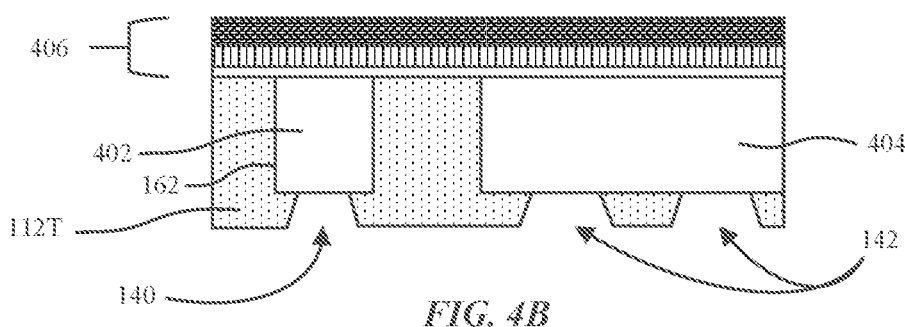
Figure 4C:
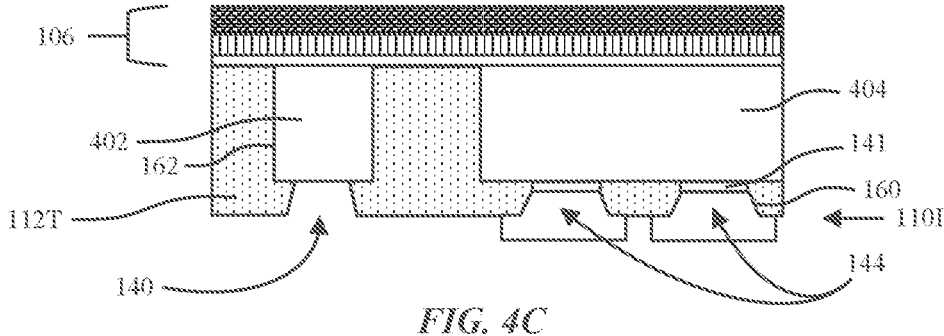
Figure 4D:
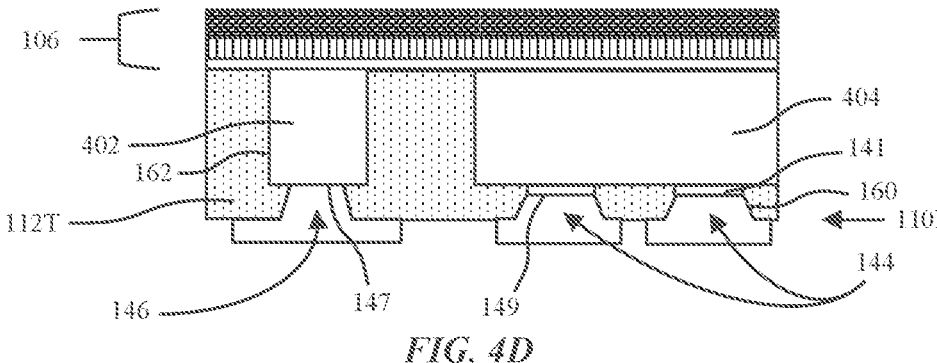
Figure 4E:
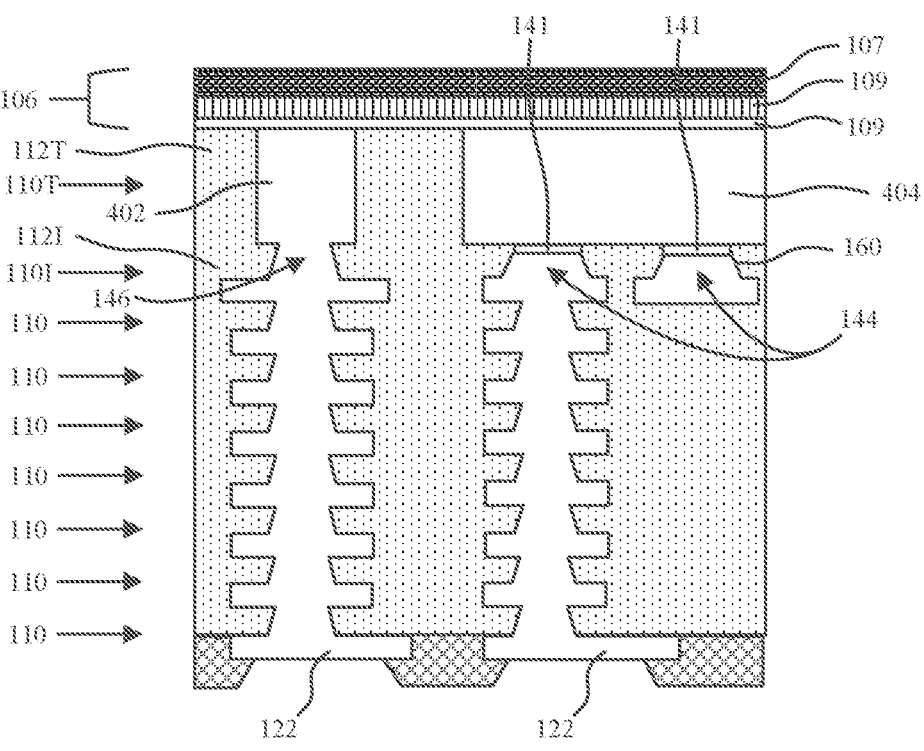

At operation 304, as shown in FIG. 4B-4E, of the top dielectric layer 112T and the remainder of the dielectric layers 112 and metal routing layers 110 may be formed on the metal post 402 and the sacrificial cavity layer 404. For example, as shown in FIG. 4E, the plurality of dielectric layers may include the top dielectric layer 112T and intermediate dielectric layer 112I. Referring to FIG. 4B, the top dielectric layer 112T may be formed using a suitable technique such as traditional solution based techniques such as spin coating, spray coating, slot coating, etc., physical or chemical vapor deposition techniques, or lamination. In accordance with embodiment lamination may be utilized due to manufacturing simplicity. The top dielectric layer 112T may be patterned to form first via openings 140 to the metal posts 402 and second via openings 142 to the sacrificial cavity layer 404. For example, patterning may be performed with a laser ablation/drilling technique though other etching techniques can also be utilized. Referring to FIG. 4C, an etch stop layer 141 is optionally selectively formed in the second via openings 142. The etch stop layer 141 may be formed of a different material, such as nickel, than the material used to for the bulk of the metal wiring layers 110. The etch stop layer 141 may optionally be formed within the first via openings 140, though this is not required. As shown in FIGS. 4C-4D, an intermediate metal layer 110I including intermediate metal vias 144 may be formed in the second via openings 142 an on the etch stop layers 141, and intermediate metal vias 146 may be formed in the first via openings 140 and in contact with the metal posts 402. As shown in FIG. 4D, the top surfaces 147 of the intermediate metal vias 146 (e.g., bulk portion) may be above top surfaces 149 of intermediate metal vias 144 (e.g., bulk portion) by a thickness that corresponds to the thickness of the selectively deposited etch stop layer 141. Based on the formation of laser etch and plating, the intermediate metal vias 144, 146 may have tapered sidewalls 160. Referring to FIG. 4E, the remaining dielectric layers 112 and metal routing layers 110 may be formed, terminating with contact pads 122.

Figure 4F:
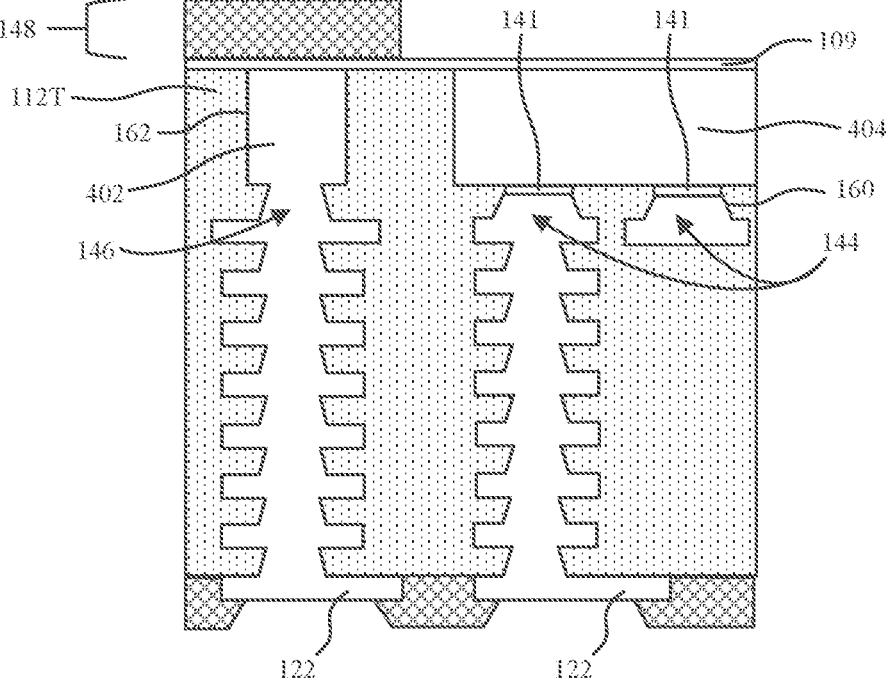
Figure 4G:
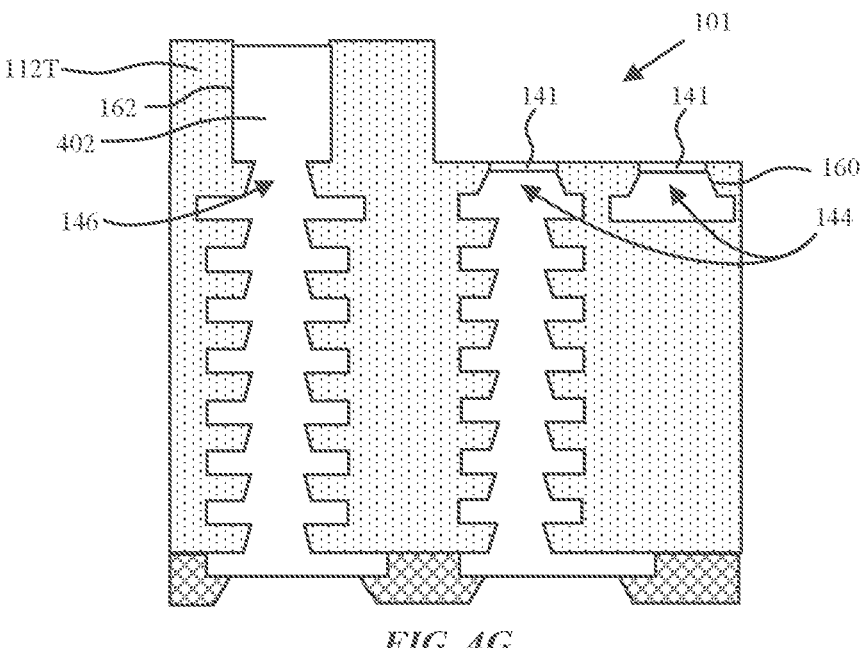
Figure 4H:
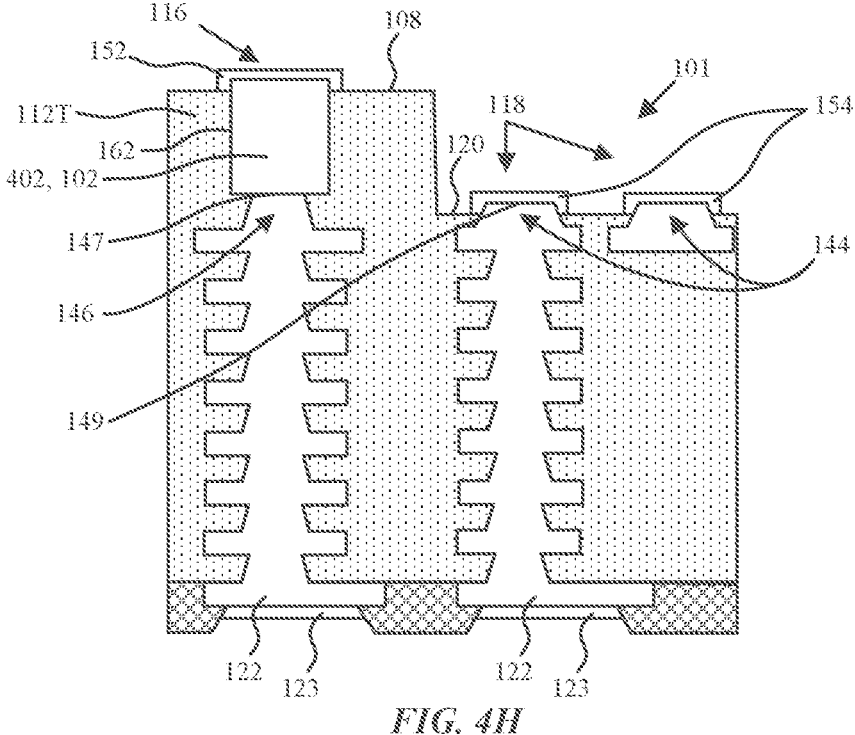

At operation 306, as shown in FIGS. 4F-4G, the carrier substrate 406 may be removed, followed by removal of the sacrificial cavity layer 404 to form the cavity 101 in the top surface 108 of the top dielectric layer 112T. Referring to FIG. 4F, the carrier core may be removed and a dry film resist (DFR) mask 148 may be added to protect the underlying metal posts 402. A copper etch may then be performed to remove the exposed copper foil 109 and sacrificial cavity layer 404, with etching stopping on the etch stop layers 141 and exposed dielectric layers. Referring to FIG. 4G, the DFR mask 148 may be removed along with any remaining copper foil layers to expose the metal posts 402. At this point, the etch stop layers 141 can optionally be removed, which would result in the top surfaces 147 of the intermediate metal vias 146 being above the top surfaces 149 of the intermediate metal vias 144. Alternatively, where etch stop layers 141 are also formed on intermediate metal vias 146 the artifact of the etch stop layers 141 will still be present on top of the intermediate metal vias 146. Referring to FIG. 4H, a portion of the topmost surface of the exposed top dielectric layer 112T and intermediate dielectric layer 112I may be etched at operation 308 so that a thickness of the metal posts 402 (e.g., bulk layer 102) protrudes from the topmost surface 108 of the top dielectric layer 112T and a thickness of the intermediate metal vias 144 protrudes from the bottom cavity surface 120 formed form the intermediate dielectric layer 112I. A first surface finishing layer 152 (e.g., a nickel-palladium-gold layer stack) may be formed over the metal posts 402 (e.g., bulk layer 102), and a second surface finishing layer 154 is formed over the exposed intermediate metal vias 144 within the cavity 101. The first surface finishing layer 152 and the second surface finishing layer 154 may be simultaneously formed. As shown surface finishing layers 123 can also be formed on the contact pads 122 on the back side of the routing substrate 100. A combination of the metal posts 402 and the first surface finishing layer 152 that is deposited after etch-back may form the first plurality of first SMT metal bumps 116. A combination of the intermediate metal vias 144 and the second surface finishing layer 154 that is deposited after etch-back may form the second plurality of second SMT metal bumps 118.

Figure 5:
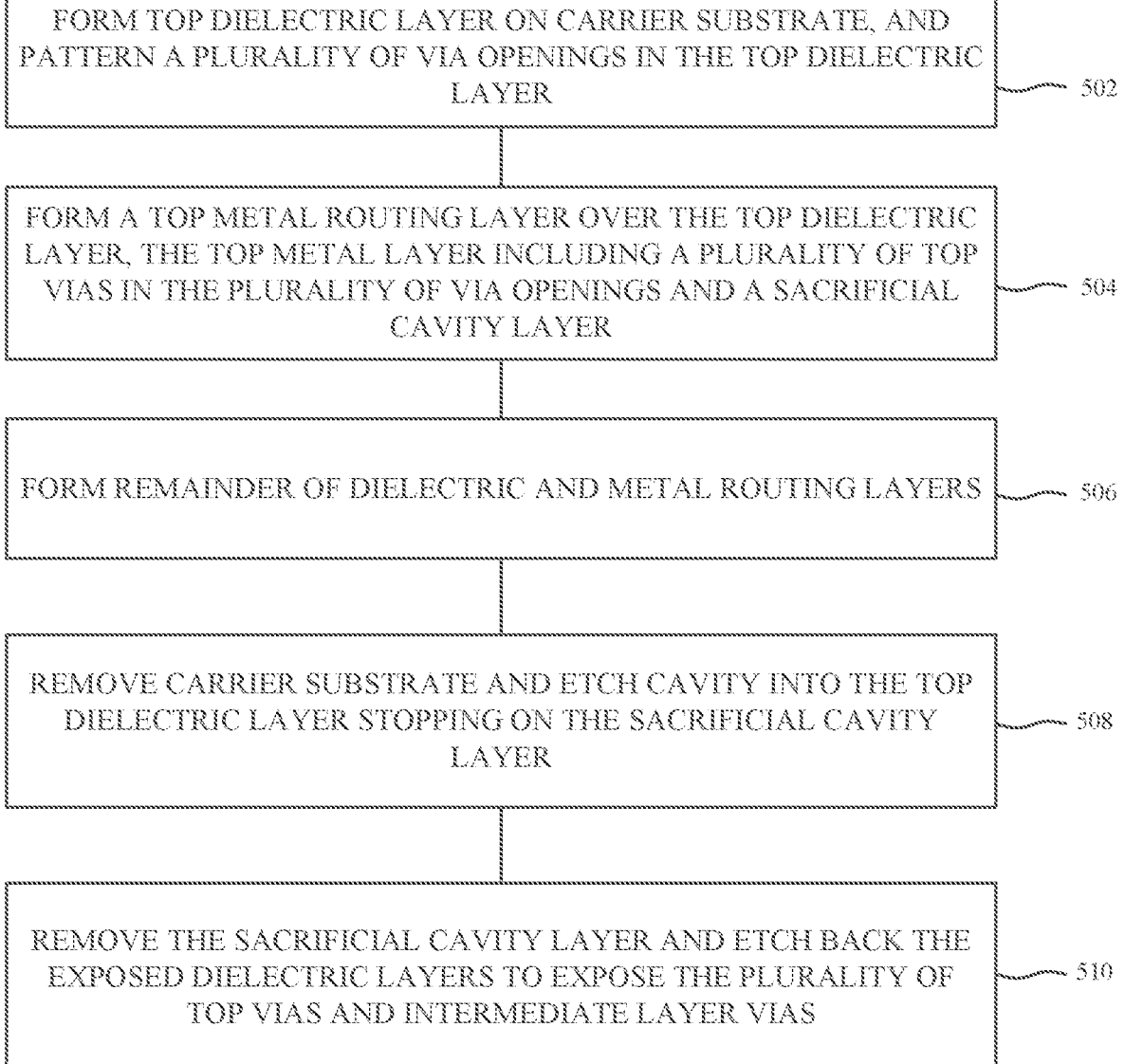
FIG. 5 is a flow chart illustrating a method of fabricating a routing substrate including a cavity for component stacking in accordance with an embodiment.

FIG. 5 is a flow chart illustrating a method of fabricating a routing substrate including a cavity for component stacking in accordance with an embodiment. FIGS. 6A-6H are schematic cross-sectional side view illustrations of a sequence of forming a routing substrate including a cavity for component stacking in accordance with an embodiment. For example, the flow chart of FIG. 5 and the sequences illustrated in FIGS. 6A-6H may be utilized to form the routing substrate 100 of FIG. 2. In interest of clarity and conciseness, the flow chart of FIG. 5 is described concurrently with the sequences illustrated in FIGS. 6A-6H. Furthermore, where specific details or like features and processing conditions have previously been described they may not be repeated in the following description.

Figures 6A, 6B, 6C, 6D:
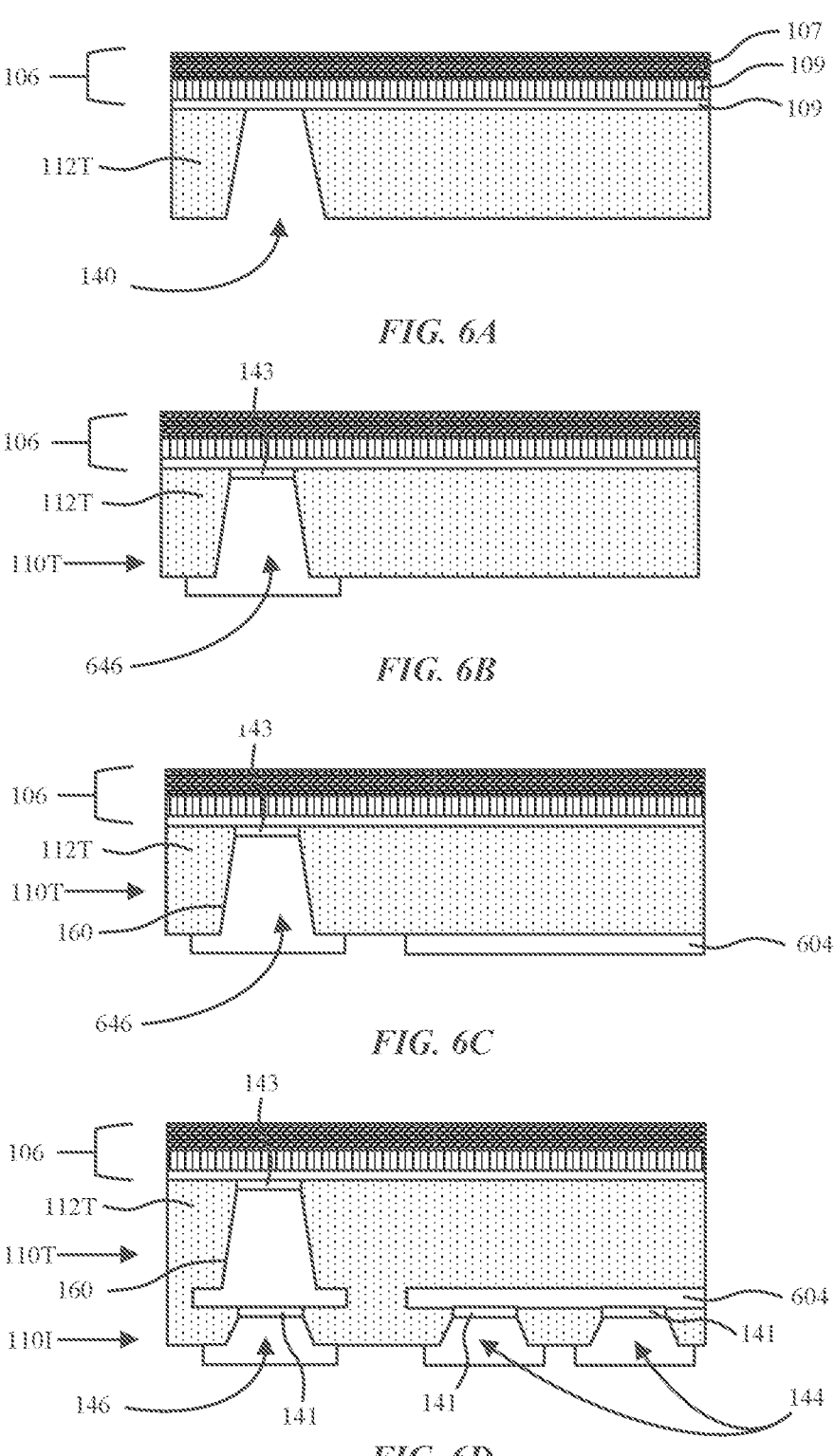
FIGS. 6A-6H are schematic cross-sectional side view illustrations of a sequence of forming a routing substrate including a cavity for component stacking in accordance with an embodiment.

At operation 502, as shown in FIG. 6A, a top dielectric layer 112T may be formed on a carrier substrate 106. The carrier substrate 106 may include a carrier core 107 and one or more layers of copper foil 109. The top dielectric layer 112T may be formed as previously described (e.g., lamination, etc.) and patterned to form an array of first via openings 140 using a suitable technique such as wet etching, laser ablation/drilling, etc.

At operation 504, as shown in FIG. 6B, a top metal routing layer 110T having first metal vias 646 may be formed on the top dielectric layer 112T and within the first via openings 140. The first metal vias 646 may be formed using a suitable technique such as plating. As will become apparent in the following description the first metal vias 646 will become the protruding bulk layers 102 of the first SMT metal bumps 116. Prior to plating the first metal vias 646 an etch stop layer 143 (e.g., nickel) may optionally be formed, for example with a different plating bath chemistry. Additionally, referring to FIG. 6C, a sacrificial cavity layer 604 may be formed on the top dielectric layer 112T. This may be formed in a separate plating operation, or the same plating operation as first metal vias 646.

Figures 6E, 6F:
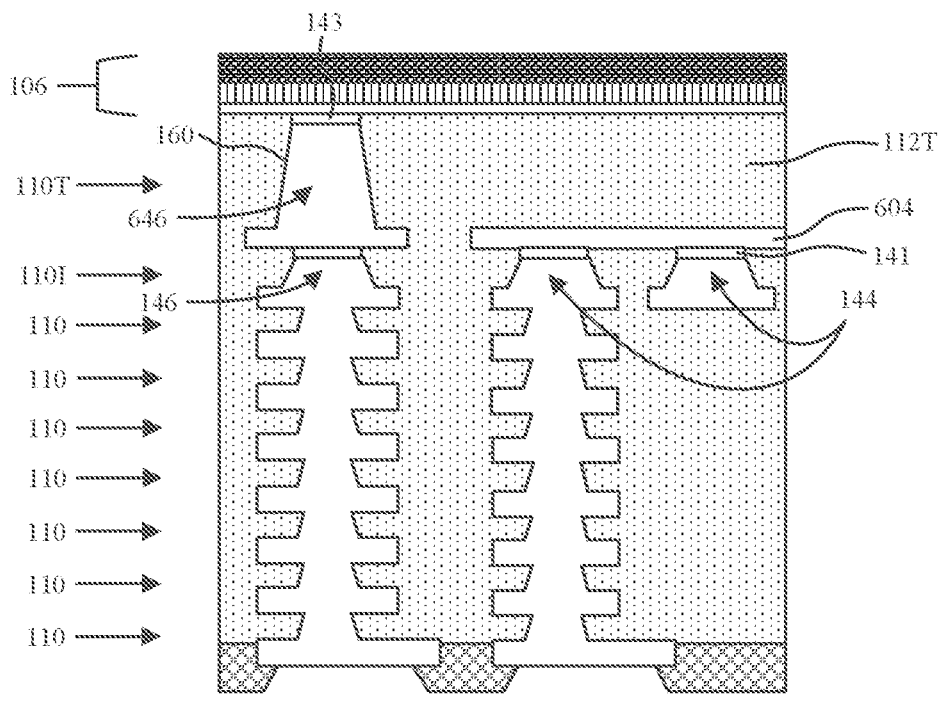

At operation 506, as shown in FIG. 6D-6E, the remainder of the dielectric layers 112 and metal routing layers 110 may be formed as previously described. The plurality of dielectric layers may include intermediate metal vias 144 connected to the sacrificial cavity layer 604 and intermediate metal vias 146 connected to the first metal vias 646. In the particular embodiment illustrated an etch stop layer 141 (e.g., nickel) may be formed prior to forming the intermediate metal vias 144, and optionally with intermediate metal vias 146.

Figure 6G:
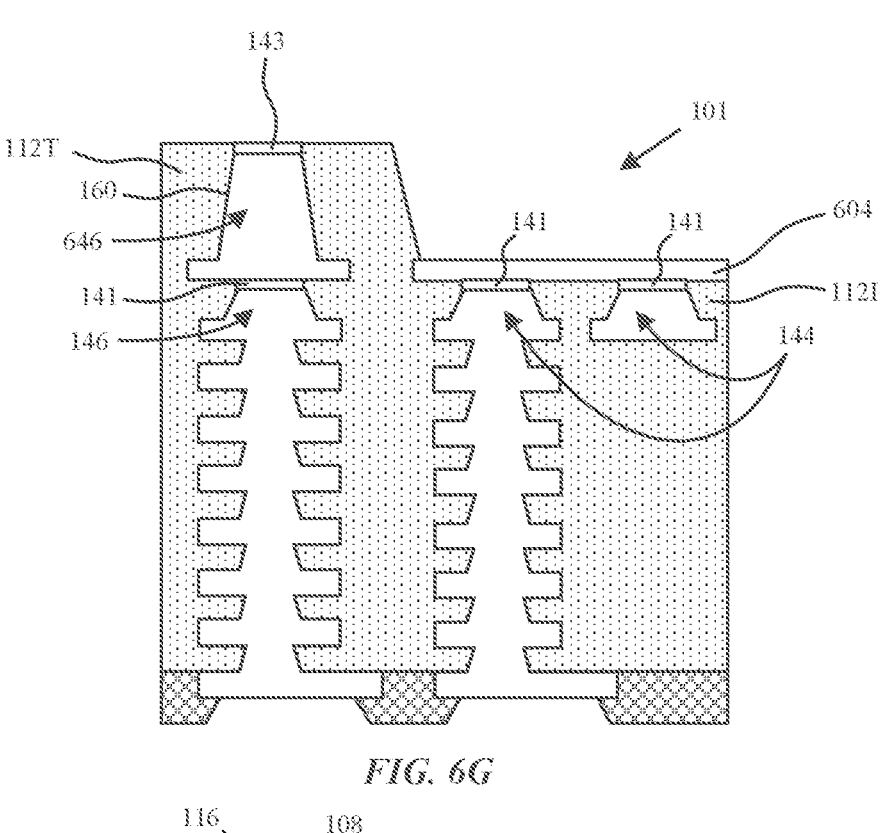
Figure 6H:
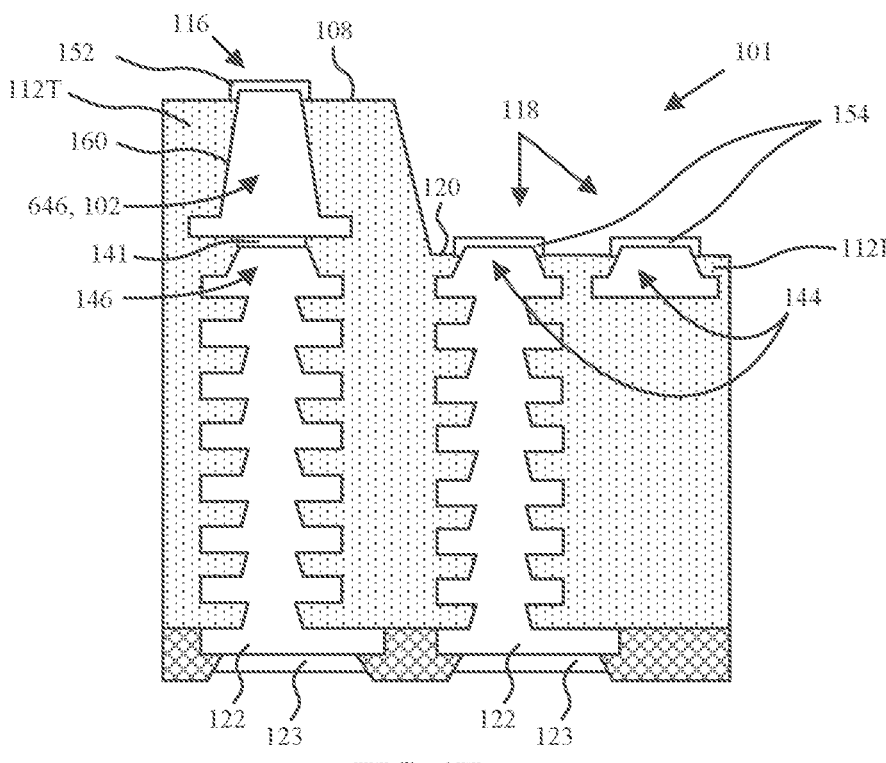

At operation 508, as shown in FIGS. 6F-6G, the carrier substrate 106 may be removed, followed by etching, or drilling of the cavity 101 through the top dielectric layer 112T stopping on the sacrificial cavity layer 604. The sacrificial cavity layer 604 may then be selectively removed at operation 510, while etch stop layers 143, 141 protect the underlying bulk copper layers. The etch stop layers 143, 141 may then be selectively removed, followed by etch-back of the exposed top dielectric layer 112T and intermediate dielectric layer 112I in the cavity 101 so that the first metal vias 646 (e.g., bulk metal layer 102) and the intermediate metal vias 144 protrude from the topmost surface 108 and bottom cavity surface 120, respectively. In some cases, the process sequence described herein could be modified to achieve higher product yield and/or easier process quality control. For example, etch-back of the top dielectric layer 112T and/or intermediate dielectric layer 112I can occur before removing the etch stop layers 143, 141. Surface finishing layers 152, 154 may then be formed as previously described. As shown surface finishing layers 123 can also be formed on the contact pads 122 on the back side of the routing substrate 100. In the particular embodiment illustrated in FIG. 6H, the optional etch stop layer 141 is not removed from the intermediate metal vias 144 contacting the first metal via 646.

FIG. 7 is a flow chart illustrating a method of fabricating a routing substrate including a cavity for component stacking in accordance with an embodiment. FIGS. 8A-8F are schematic cross-sectional side view illustrations of a sequence of forming a routing substrate including a cavity for component stacking in accordance with an embodiment. For example, the flow chart of FIG. 7 and the sequences illustrated in FIGS. 8A-8F may form a hybrid of the routing substrate 100 of FIG. 1 and the routing substrate 100 of FIG. 2. In interest of clarity and conciseness, the flow chart of FIG. 7 is described concurrently with the sequences illustrated in FIGS. 8A-8F. Furthermore, where specific details or like features and processing conditions have previously been described they may not be repeated in the following description.

Figure 8A:
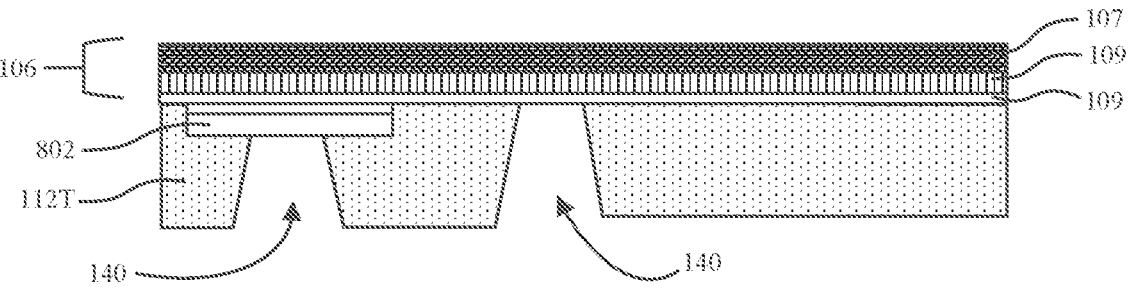
FIGS. 8A-8F are schematic cross-sectional side view illustrations of a sequence of forming a routing substrate including a cavity for component stacking in accordance with an embodiment.

At operation 702, a first plurality of top landing pads 802 are formed on a carrier substrate 106, for example by plating, as shown in FIG. 8A. The plating operation may include formation of an etch stop layer 143, such as nickel, followed by plating of the top landing pads 802, corresponding to a copper bulk layer. As will become apparent in the following description, the top landing pads 802 will correspond to SMT metal bump size, and thus size can be decoupled from underlying via structures, and will become the protruding bulk layers 102 of the first SMT metal bumps 116. Still referring to FIG. 8A, at operation 704 a top dielectric layer 112T may be formed on a carrier substrate 106 and over the plurality of top landing pads 802, followed by patterning of the top dielectric layer 112T to form a plurality of via openings 140 exposing the top landing pads 802. Via openings 140 are also illustrated as contacting the copper foil 109 where a top landing pad 802 is not formed. Such a combination of features may be present in accordance with embodiments. This side-by-side illustration also shows the ability to provide larger top landing pads 802 over via structures with smaller total x-y dimensions.

Figure 8B:
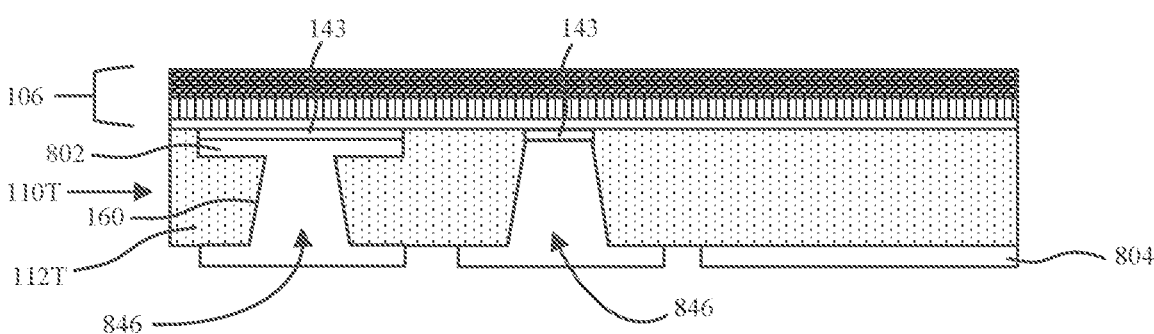
Figure 8C:
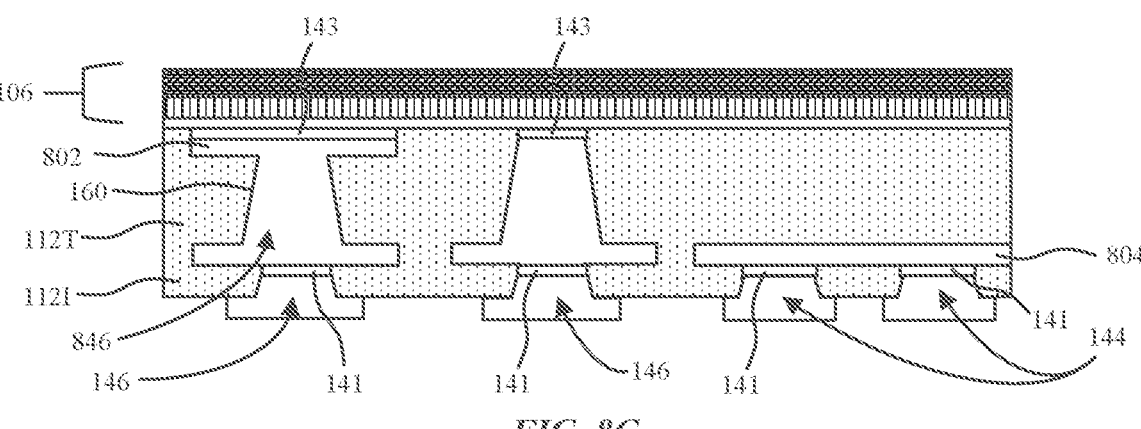
Figure 8D:
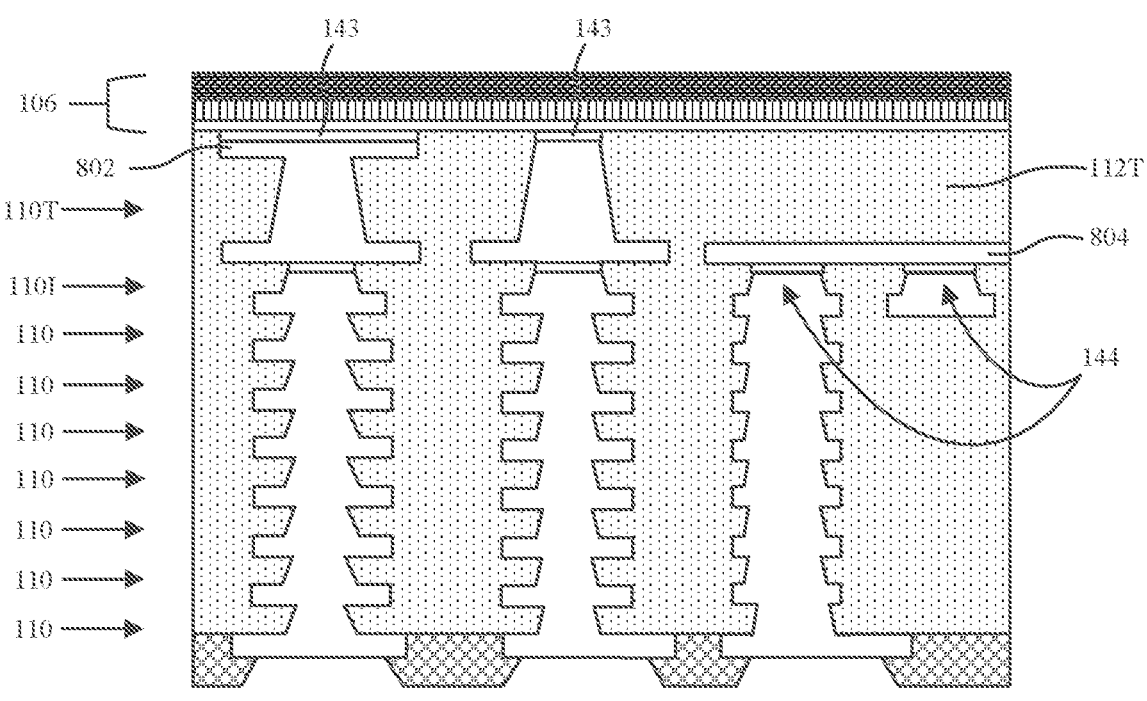
Figure 8E:
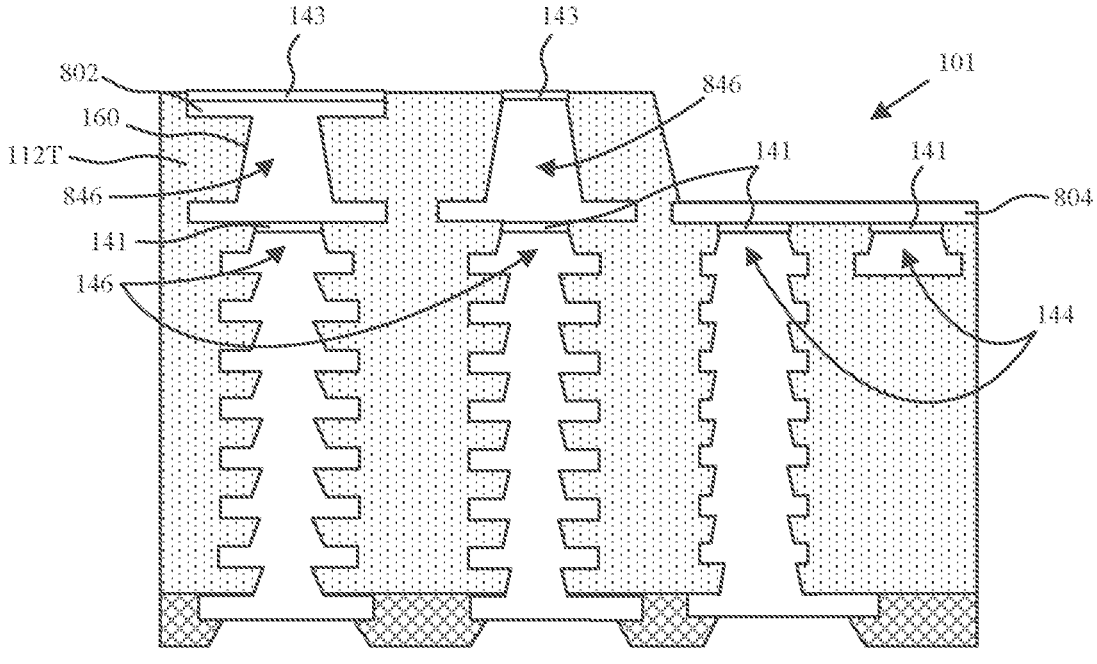

As shown in FIG. 8B, a top metal rouging layer 110T can then be formed over the top dielectric layer 112T. The top metal routing layer 110T can include a plurality of top vias 846 in the plurality of via openings 140 and a sacrificial cavity layer 804.

Figure 8F:
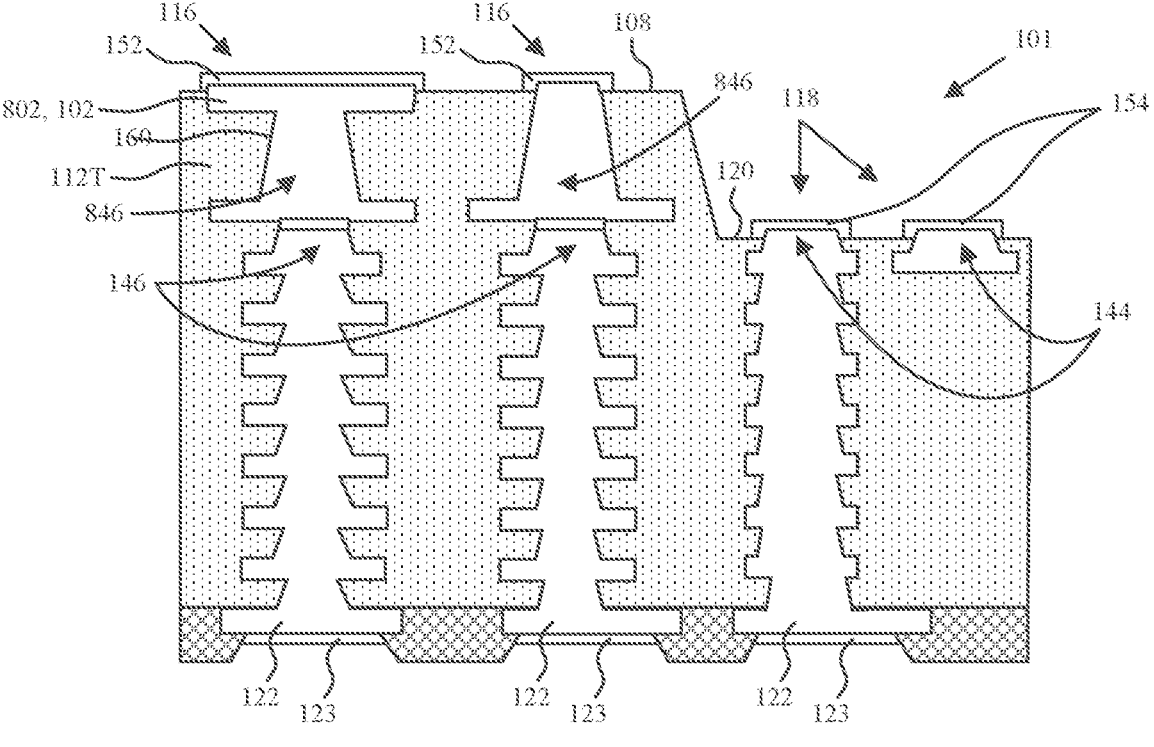

Referring now to FIGS. 8B-8F the processing sequence of operations 706, 708, 710, 712 may proceed substantially the same as that previously described and illustrated with regard to operations 504, 506, 508, 510. One notable difference is that as shown in FIG. 8F, during the etch-back operation, etching of the top dielectric layer 112T to exposes the bulk metal layer of the top landing pads 802, which can have a larger pad size that would normally be accomplished with the first vias.

Some implementations may include a routing substrate including: a plurality of metal routing layers; a plurality of dielectric layers including a top dielectric layer forming a topmost surface; a cavity formed in the topmost surface, the cavity including a bottom cavity surface; a first plurality of first SMT metal bumps embedded within the top dielectric layer and protruding from the topmost surface of the top dielectric layer; and a second plurality of second SMT metal bumps embedded within an intermediate dielectric layer of the plurality of dielectric layers and protruding from the bottom cavity surface. In some implementations, the routing substrate is a coreless substrate. In some implementations, the plurality of dielectric layers is a plurality of non-glass reinforced organic material layers. In some implementations, the plurality of dielectric layers may be a mixture of non-glass reinforced organic layers and glass fiber reinforced organic layers. In some implementations, the cavity extends through more than one of the plurality of dielectric layers. In some implementations, the plurality of dielectric layers is a plurality of cured resin layers. In some implementations, the routing substrate further includes a plurality of contact pads on a back side of the routing substrate opposite the topmost surface. In some implementations, each second SMT metal bump of the second plurality of second SMT metal bumps includes an intermediate metal via embedded in the intermediate dielectric layer and protruding from the bottom cavity surface, and a second surface finishing layer over the intermediate metal via. In some implementations, the second surface finishing layer includes a nickel-palladium-gold layer stack, and the intermediate metal via includes copper. In some implementations, each first SMT metal bump of the first plurality of first SMT metal bumps includes a first bulk metal layer embedded in the top dielectric layer and protruding from the topmost surface, and a surface finishing layer over the first bulk metal layer. In some implementations, each intermediate metal via is formed in an intermediate metal routing layer of the plurality of metal routing layers; and the intermediate metal routing layer further includes a plurality of intermediate metal vias connected to the first plurality of first SMT metal bumps. In some implementations, top surfaces of the plurality of intermediate metal vias are above top surfaces of each intermediate metal via. In some implementations, the first bulk metal layer is a first metal pad; and each first metal pad is wider than each intermediate metal via. In some implementations, the plurality of intermediate metal vias are connected to the first plurality of first SMT metal bumps with a plurality of top vias extending partially through the top dielectric layer. In some implementations, each top via has tapered sidewalls such that the top via is widest adjacent to a corresponding intermediate metal via. In some implementations, the first bulk metal layer for each first SMT metal bump is a post extending through a thickness of the top dielectric layer. In some implementations, each post has substantially straight sidewalls, and each intermediate metal via has tapered sidewalls. In some implementations, the first bulk metal layer for each first SMT metal bump is a top via extending completely through a thickness of the top dielectric layer, wherein the top via has tapered sidewalls.

Some implementations may include an electronic assembly including: a routing substrate including: a plurality of metal routing layers; a plurality of dielectric layers including a top dielectric layer forming a topmost surface; a cavity formed in the topmost surface, the cavity including a bottom cavity surface; a first plurality of first SMT metal bumps embedded within the top dielectric layer and protruding from the topmost surface of the top dielectric layer; and a second plurality of second SMT metal bumps embedded within an intermediate dielectric layer the plurality of dielectric layers and protruding from the bottom cavity surface; an electronic component mounted on the second plurality of second SMT metal bumps inside the cavity; and a top die mounted on the first plurality of first SMT metal bumps. In some implementations, the top die spans over the electronic component. In some implementations, the top die is bonded to a plurality of contact pads on a top side of the electronic component. In some implementations, the electronic component is selected from the group consisting of a second die and interposer.

In utilizing the various aspects of the embodiments, it would become apparent to one skilled in the art that combinations or variations of the above embodiments are possible for forming a cavity within a routing substrate with protruding SMT metal bumps. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A routing substrate comprising:
a plurality of metal routing layers;
a plurality of dielectric layers including a top dielectric layer with a topmost surface;
a cavity formed in the topmost surface, the cavity including a bottom cavity surface;
a first plurality of first surface mount (SMT) metal bumps embedded within the top dielectric layer and protruding from the topmost surface of the top dielectric layer; and
a second plurality of second SMT metal bumps embedded within an intermediate dielectric layer of the plurality of dielectric layers and protruding from the bottom cavity surface,
wherein each first SMT metal bump of the first plurality of first SMT metal bumps includes a first bulk metal layer embedded in the top dielectric layer and protruding from the topmost surface, and a first surface finishing layer over the first bulk metal layer, and each second SMT metal bump of the second plurality of second SMT metal bumps includes an intermediate metal via embedded in the intermediate dielectric layer and protruding from the bottom cavity surface, and a second surface finishing layer over the intermediate metal via.

2. The routing substrate of claim 1, wherein the routing substrate is a coreless substrate.

3. The routing substrate of claim 2, wherein the plurality of dielectric layers is a plurality of non-glass reinforced organic material layers.

4. The routing substrate of claim 2, wherein the cavity extends through more than one of the plurality of dielectric layers.

5. The routing substrate of claim 4, wherein the plurality of dielectric layers is a plurality of cured resin layers.

6. The routing substrate of claim 1, further comprising a plurality of contact pads on a back side of the routing substrate opposite the topmost surface.

7. The routing substrate of claim 1, wherein the second surface finishing layer comprises a nickel-palladium-gold layer stack, and the intermediate metal via comprises copper.

8. The routing substrate of claim 1, wherein:
the first bulk metal layer is a first metal pad; and
each first metal pad is wider than each second metal via.

9. The routing substrate of claim 8, wherein the first bulk metal layer for each first SMT metal bump is a post extending through a thickness of the top dielectric layer.

10. The routing substrate of claim 9, wherein each post has substantially straight sidewalls, and each second metal via has tapered sidewalls.

11. The routing substrate of claim 8, wherein the first bulk metal layer for each first SMT metal bump is a top via extending completely through a thickness of the top dielectric layer, wherein the top via has tapered sidewalls.

12. The routing substrate of claim 1, wherein:

each intermediate metal via is formed in an intermediate metal routing layer of the plurality of metal routing layers; and the intermediate metal routing layer further comprises a second plurality of intermediate metal vias connected to the first plurality of first SMT metal bumps.

13. The routing substrate of claim 12, wherein top surfaces of the second plurality of intermediate metal vias are above top surfaces of each intermediate metal via protruding from the bottom cavity surface.

14. The routing substrate of claim 12, wherein the plurality of intermediate metal vias are connected to the first plurality of first SMT metal bumps with a plurality of top vias extending partially through the top dielectric layer.

15. The routing substrate of claim 14, wherein each top via has tapered sidewalls such that the top via is widest adjacent to a corresponding intermediate metal via.

16. An electronic assembly comprising:

a routing substrate including:

a plurality of metal routing layers;

a plurality of dielectric layers including a top dielectric layer with a topmost surface;

a cavity formed in the topmost surface, the cavity including a bottom cavity surface;

a first plurality of first surface mount (SMT) metal bumps embedded within the top dielectric layer and protruding from the topmost surface of the top dielectric layer; and a second plurality of second SMT metal bumps embedded within an intermediate dielectric layer the plurality of dielectric layers and protruding from the bottom cavity surface;

an electronic component mounted on the second plurality of second SMT metal bumps inside the cavity; and a top die mounted on the first plurality of first SMT metal bumps, wherein the top die spans over the electronic component, and the top die is bonded to a plurality of contact pads on a top side of the electronic component.

17. An electronic assembly comprising:

a routing substrate including:

a plurality of metal routing layers;

a plurality of dielectric layers including a top dielectric layer with a topmost surface;

a cavity formed in the topmost surface, the cavity including a bottom cavity surface;

a first plurality of first surface mount (SMT) metal bumps embedded within the top dielectric layer and protruding from the topmost surface of the top dielectric layer; and a second plurality of second SMT metal bumps embedded within an intermediate dielectric layer the plurality of dielectric layers and protruding from the bottom cavity surface, wherein each first SMT metal bump of the first plurality of first SMT metal bumps includes a first bulk metal layer embedded in the top dielectric layer and protruding from the topmost surface, and a first surface finishing layer over the first bulk metal layer, and each second SMT metal bump of the second plurality of second SMT metal bumps includes an intermediate metal via embedded in the intermediate dielectric layer and protruding from the bottom cavity surface, and a second surface finishing layer over the intermediate metal via;

an electronic component mounted on the second plurality of second SMT metal bumps inside the cavity; and a top die mounted on the first plurality of first SMT metal bumps.

18. The electronic assembly of claim 17, wherein the top die spans over the electronic component.

19. The electronic assembly of claim 18, wherein the top die is bonded to a plurality of contact pads on a top side of the electronic component.

20. The electronic assembly of claim 17, wherein the routing substrate is a coreless substrate.

* * * * *